(12) United States Patent
Yabuta et al.

(10) Patent No.: US 12,170,209 B2
(45) Date of Patent: Dec. 17, 2024

(54) SUBSTRATE PROCESSING APPARATUS AND SUBSTRATE PROCESSING METHOD

(71) Applicant: Tokyo Electron Limited, Tokyo (JP)

(72) Inventors: Takashi Yabuta, Kumamoto (JP); Hidetoshi Nakao, Kumamoto (JP); Masatoshi Kasahara, Kumamoto (JP); Daisuke Saiki, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 354 days.

(21) Appl. No.: 17/443,358

(22) Filed: Jul. 26, 2021

(65) Prior Publication Data

US 2022/0037167 A1 Feb. 3, 2022

(30) Foreign Application Priority Data

Jul. 29, 2020 (JP) .................. 2020-128456

(51) Int. Cl.
| | |
|---|---|
| *H01L 21/67* | (2006.01) |
| *B01F 3/04* | (2006.01) |
| *B01F 3/22* | (2006.01) |
| *B01F 23/232* | (2022.01) |
| *B01F 23/80* | (2022.01) |
| *H01L 21/306* | (2006.01) |
| *B01F 23/237* | (2022.01) |

(52) U.S. Cl.
CPC ........ *H01L 21/6708* (2013.01); *B01F 23/232* (2022.01); *B01F 23/807* (2022.01); *H01L 21/30604* (2013.01); *B01F 23/2376* (2022.01)

(58) Field of Classification Search
None
See application file for complete search history.

(56) References Cited

U.S. PATENT DOCUMENTS

| | | | | |
|---|---|---|---|---|
| 4,233,106 A | * | 11/1980 | Goffredo | ............... C23F 1/00 |
| | | | | 134/10 |
| 6,444,589 B1 | * | 9/2002 | Yoneya | ............. H01L 21/02019 |
| | | | | 257/E21.219 |
| 7,931,035 B2 | * | 4/2011 | Park | ..................... B08B 3/02 |
| | | | | 134/186 |

(Continued)

FOREIGN PATENT DOCUMENTS

| | | | |
|---|---|---|---|
| JP | 2006-269668 A | | 10/2006 |
| JP | 2009049108 A | * | 3/2009 |

(Continued)

*Primary Examiner* — Sylvia MacArthur
(74) *Attorney, Agent, or Firm* — Armstrong Teasdale LLP (57) ABSTRACT

A substrate processing apparatus includes: at least one processing part for etching a polysilicon film or an amorphous silicon film formed on a substrate using an alkaline chemical liquid; a reservoir configured to recover and store the chemical liquid used in the at least one processing part; processing lines configured to supply the chemical liquid stored in the reservoir to the at least one processing part; a circulation line configured to take out the chemical liquid from the reservoir and to return the same to the reservoir; and a first gas supply line connected to the circulation line and configured to supply an inert gas to the circulation line. The circulation line includes an ejection port configured to eject a mixed fluid of the inert gas supplied by the first gas supply line and the chemical liquid taken out from the reservoir into the chemical liquid stored in the reservoir.

8 Claims, 5 Drawing Sheets

(56) References Cited

U.S. PATENT DOCUMENTS

| | | | | |
|---|---|---|---|---|
| 8,043,467 | B2* | 10/2011 | Nanba | ............... H01L 21/31055 |
| | | | | 156/345.55 |
| 8,864,933 | B2* | 10/2014 | Terada | .............. H01L 21/31111 |
| | | | | 156/345.52 |
| 10,236,192 | B2* | 3/2019 | Nonaka | ............... H01L 21/6708 |
| 2013/0220478 | A1* | 8/2013 | Kasahara | .................. B65B 3/04 |
| | | | | 141/2 |
| 2014/0182455 | A1* | 7/2014 | Mizota | ............... B01D 19/0005 |
| | | | | 96/202 |
| 2017/0294323 | A1* | 10/2017 | Miura | ................. B01F 23/2323 |
| 2022/0037167 | A1* | 2/2022 | Yabuta | ............... H01L 21/6708 |

FOREIGN PATENT DOCUMENTS

| | | |
|---|---|---|
| JP | 2011-187806 A | 9/2011 |
| JP | 2013-258391 A | 12/2013 |
| JP | 2018-101677 A | 6/2018 |
| JP | 2019-061988 A | 4/2019 |
| WO | WO-2020145002 A1 * | 7/2020 |

* cited by examiner

| Operating mode of substrate processing apparatus | Liquid storage | Standby | Substrate processing ($1 \leq N \leq 2$) | Substrate processing ($3 \leq N \leq 5$) |
|---|---|---|---|---|
| Flow rate in 1st gas supply line | Q1+Q2 | 0 | Q1 | Q2(Q2>Q1) |
| Flow rate in 2nd gas supply line | Q3 | 0 | Q3 | Q3 |
| Flow rate in 3rd gas supply line | Q4 | Q4 | Q4 | Q4 |
| Flow rate in 4th gas supply line | 0 | 0 | Q5 | Q5 |

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2020-128456, filed on Jul. 29, 2020, the entire contents of which are incorporated herein by reference.

TECHNICAL FIELD

The present disclosure relates to a substrate processing apparatus and a substrate processing method.

BACKGROUND

In the substrate processing method disclosed in Patent Document 1, the polysilicon film formed on the substrate is etched by ejecting a tetramethylammonium hydroxide (TMAH)-containing chemical liquid in which the oxygen gas is dissolved from the chemical liquid nozzle. In this substrate processing method, the oxygen gas is dissolved in the TMAH-containing chemical liquid so as to control an etching rate.

PRIOR ART DOCUMENT

Patent Document

Patent Document 1: Japanese Laid-Open Patent Publication No. 2013-258391

SUMMARY

A substrate processing apparatus according to an embodiment of the present disclosure includes: at least one processing part configured to etch a polysilicon film or an amorphous silicon film formed on a substrate using an alkaline chemical liquid; a reservoir configured to recover and store the chemical liquid used in the at least one processing part; processing lines configured to supply the chemical liquid stored in the reservoir to the at least one processing part; a circulation line configured to take out the chemical liquid from the reservoir and to return the taken-out chemical liquid to the reservoir; and a first gas supply line connected to the circulation line and configured to supply an inert gas to the circulation line, wherein the circulation line includes an ejection port configured to eject a mixed fluid of the inert gas supplied by the first gas supply line and the chemical liquid taken out from the reservoir into the chemical liquid stored in the reservoir.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of the present disclosure will be described with reference to the drawings. In each drawing, the same or corresponding components may be denoted by the same reference numerals, and a description thereof may be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
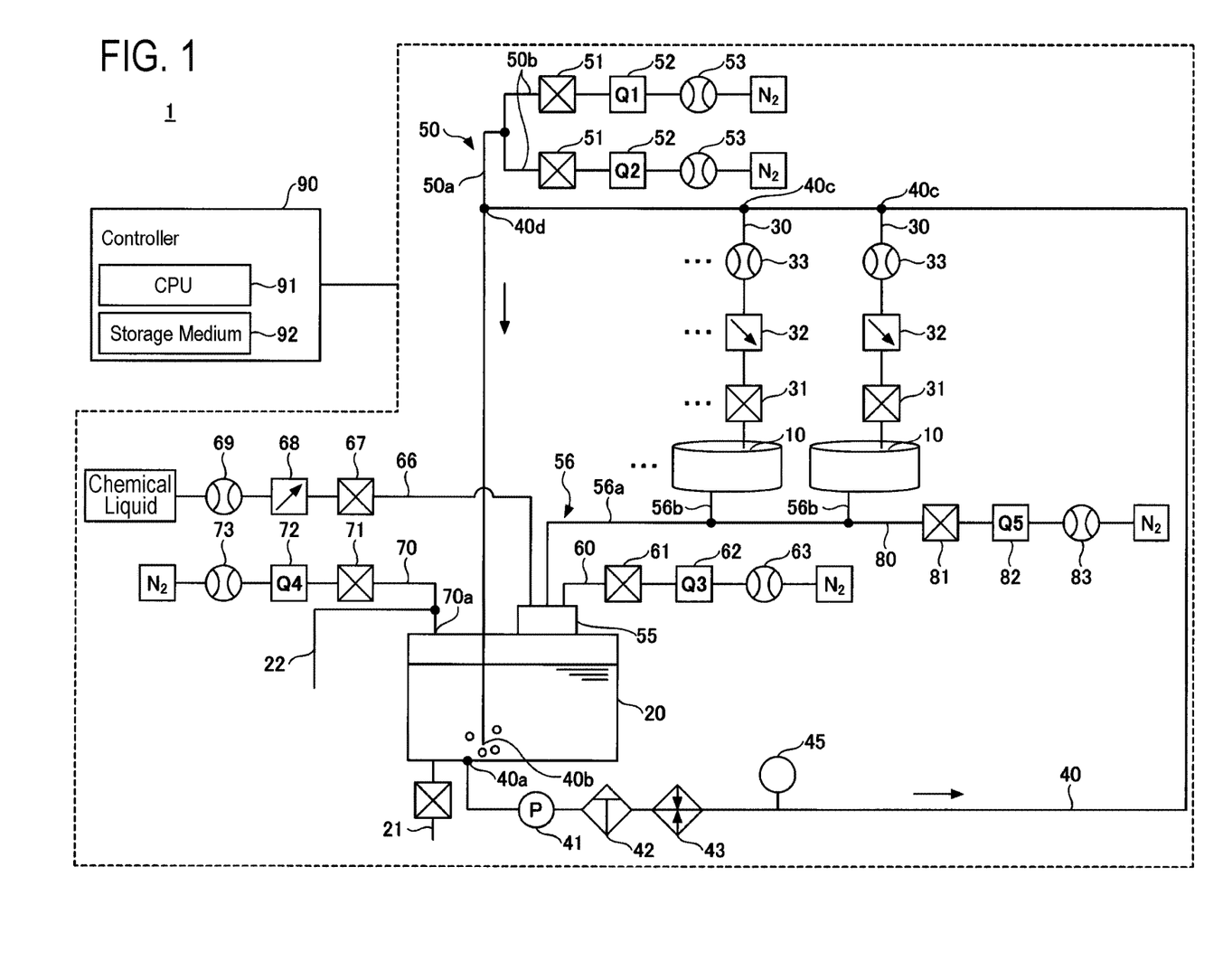
FIG. 1 is a view illustrating a substrate processing apparatus according to an embodiment.

As illustrated in FIG. 1, a substrate processing apparatus 1 includes a processing part 10. The processing part 10 etches a polysilicon film formed on a substrate using an alkaline chemical liquid. An amorphous silicon film may be formed instead of the polysilicon film, and the chemical liquid may etch the amorphous silicon film.

Figure 2:
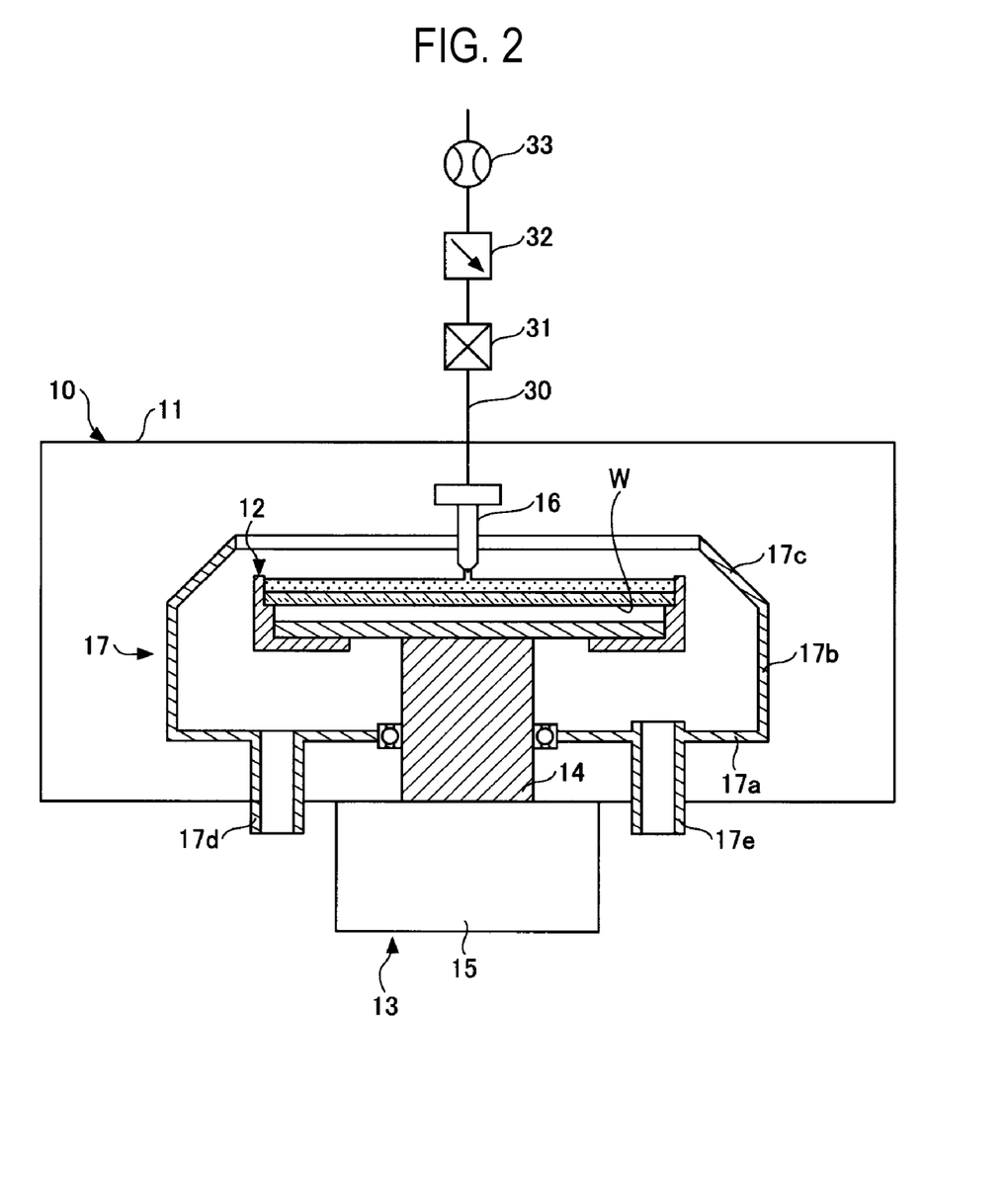
FIG. 2 is a view illustrating a processing part according to an embodiment.

As illustrated in FIG. 2, the processing part 10 includes a processing container 11, a holder 12 configured to hold a substrate W horizontally, a rotation part 13 configured to rotate the holder 12 around a vertical rotation shaft 14, and a nozzle 16 configured to eject liquid on the top surface of the substrate W held by holder 12. In the present embodiment, the processing part 10 is a single-wafer type one that processes substrates W one by one, but may be a batch type one that processes a plurality of the substrates W at the same time. In the case of the batch type processing part, the holder 12 may hold the substrates W vertically.

The processing container 11 accommodates the substrate W therein. The processing container 11 has a gate (not illustrated) and a gate valve (not illustrated) configured to open/close the gate. The substrate W is carried into the processing container 11 through the gate, processed with a chemical liquid inside the processing container 11, and then carried out of the processing container 11 through the gate.

The holder 12 horizontally holds the substrate W carried into the processing container 11. The holder 12 holds the substrate W horizontally such that the surface of the substrate W on which the polysilicon film is formed is oriented upwards and the center of the substrate W coincides with the rotation center line of the rotation shaft 14. The holder 12 is a mechanical chuck in FIG. 2, but may be a vacuum chuck, an electrostatic chuck, or the like. The holder 12 may be a rotatable spin chuck.

The rotation part 13 includes, for example, the vertical rotation shaft 14 and a rotation motor 15 configured to rotate the rotation shaft 14. A rotational driving force of the rotation motor 15 may be transmitted to the rotation shaft 14 via a rotation transmission mechanism, such as a timing belt or a gear. When the rotation shaft 14 is rotated, the holder 12 is also rotated.

The nozzle 16 supplies an alkaline chemical liquid toward the substrate W held by the holder 12. The nozzle 16 has an ejection port configured to eject the chemical liquid. The nozzle 16 is arranged above the substrate W such that the ejection port is oriented downwards. The nozzle 16 is movable above the substrate W in the radial direction of the substrate W.

The nozzle 16 supplies the chemical liquid to, for example, the central portion of the substrate W. The chemical liquid is supplied to the central portion of the rotating substrate W, and forms a liquid film by being spread over the entire top surface of the substrate W by a centrifugal force. The polysilicon film is etched by the liquid film.

The chemical liquid is, for example, a TMAH-containing chemical liquid containing tetramethylammonium hydroxide (TMAH). The chemical liquid is a TMAH-containing chemical liquid in the present embodiment, but any chemical liquid may be used as long as it etches a polysilicon film. For example, the chemical liquid may be an ammonia solution, a choline solution, or the like.

The nozzle 16 may eject a rinsing liquid and a drying liquid in addition to the chemical liquid for etching. A liquid for processing the substrate W, such as a chemical liquid, a rinsing liquid, or a drying liquid, is also called a "processing liquid". One nozzle 16 may sequentially eject plural types of processing liquids, or a plurality of nozzles 16 may eject different processing liquids.

The rinsing liquid is, for example, deionized water (DIW). The rinsing liquid is used to remove a chemical liquid. The rinsing liquid is supplied to the central portion of the rotating substrate W and is spread over the entire top surface of the substrate W by a centrifugal force to wash away the chemical liquid remaining on the top surface of the substrate W. As a result, a liquid film of the rinsing liquid is formed on the top surface of the substrate W.

The drying liquid is an organic solvent, such as isopropyl alcohol (IPA). The organic solvent has a lower surface tension than that of the rinsing liquid. Therefore, it is possible to suppress the collapse of an uneven pattern due to surface tension. The drying liquid is supplied to the central portion of the rotating substrate W and is spread over the entire top surface of the substrate W by a centrifugal force to replace the rinsing liquid remaining on the top surface of the substrate W. As a result, a liquid film of the drying liquid is formed on the top surface of the substrate W.

The nozzle 16 may eject a chemical liquid different from the chemical liquid for etching. For example, a chemical liquid for cleaning may be ejected prior to the chemical liquid for etching. It is possible to remove the contaminants on the polysilicon film before etching using the chemical liquid for cleaning. Examples of the chemical liquid for cleaning include dilute hydrofluoric acid (DHF), SC-1 (an aqueous solution containing ammonium hydroxide and hydrogen peroxide), SC-2 (an aqueous solution containing hydrogen chloride and hydrogen peroxide), and the like.

The processing part 10 includes a cup 17 configured to recover the chemical liquid or the like supplied to the substrate W. The cup 17 surrounds the peripheral edge of the substrate W held by the holder 12, and receives a chemical liquid or the like scattered from the peripheral edge of the substrate W. Although the cup 17 does not rotate together with the rotation shaft 14 in this embodiment, the cup 17 may rotate together with the rotation shaft 14.

The cup 17 includes a horizontal bottom wall 17a, an outer peripheral wall 17b extending upwards from the peripheral edge of the bottom wall 17a, and an inclined wall 17c extending diagonally upwards from the upper end of the outer peripheral wall 17b radially inward of the outer peripheral wall 17b. The bottom wall 17a is provided with a drainage pipe 17d configured to discharge the liquid accumulated inside the cup 17 and an exhaust pipe 17e configured to discharge the gas accumulated inside the cup 17.

As illustrated in FIG. 1, the substrate processing apparatus 1 includes a controller 90. The controller 90 is, for example, a computer, and includes a central processing part (CPU) 91 and a storage medium 92 such as a memory. The storage medium 92 stores a program for controlling various processes to be executed in the substrate processing apparatus 1. The controller 90 controls the operation of the substrate processing apparatus 1 by causing the CPU 91 to execute the program stored in the storage medium 92.

Figure 3:
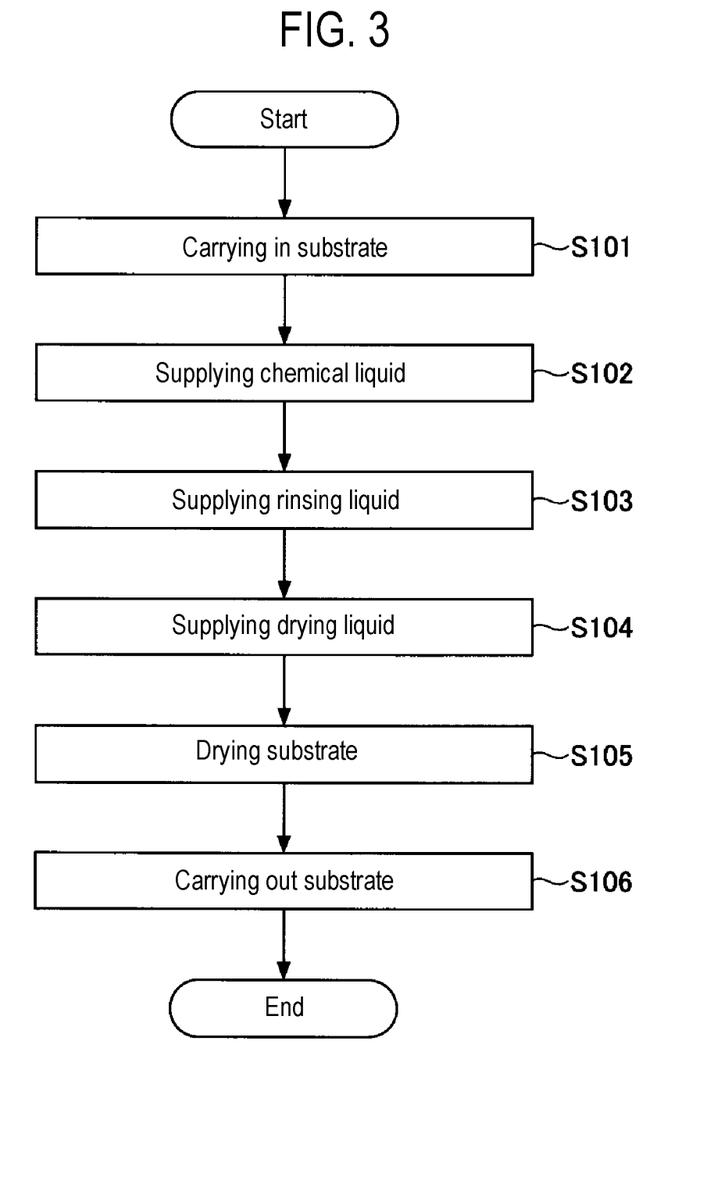
FIG. 3 is a flowchart illustrating a substrate processing method according to an embodiment.

Next, a substrate processing method will be described with reference to FIG. 3. Respective steps S101 to S106 illustrated in FIG. 3 are performed under the control of the controller 90.

First, in step S101, a transfer device (not illustrated) carries the substrate W into the processing container 11. After placing the substrate W on the holder 12, the transfer device is retracted from the interior of the processing container 11. The holder 12 receives the substrate W from the transfer device and holds the substrate W. Thereafter, the rotation part 13 rotates the substrate W together with the holder 12.

Subsequently, in step S102, the nozzle 16 supplies the chemical liquid to the central portion of the rotating substrate W. The chemical liquid is spread over the entire top surface of the substrate W by a centrifugal force to form a liquid film. The liquid film etches the polysilicon film formed on the substrate W.

Subsequently, in step S103, the nozzle 16 supplies the rinsing liquid to the central portion of the rotating substrate W. The rinsing liquid is spread over the entire top surface of the substrate W by a centrifugal force, to wash away the chemical liquid remaining on the top surface of the substrate W. As a result, a liquid film of the rinsing liquid is formed on the top surface of the substrate W.

Subsequently, in step S104, the nozzle 16 supplies the drying liquid to the central portion of the rotating substrate W. The drying liquid is spread over the entire top surface of the substrate W by a centrifugal force, to remove the rinsing liquid remaining on the top surface of the substrate W. As a result, a liquid film of the drying liquid is formed on the top surface of the substrate W.

Subsequently, in step S105, the rotation part 13 rotates the substrate W to shake off the drying liquid remaining on the top surface of the substrate W, thereby drying the substrate W. After the substrate W is dried, the rotation part 13 stops the rotation of the substrate W.

Subsequently, in step S106, the holder 12 releases the holding of the substrate W, and then the transfer device (not illustrated) receives the substrate W from the holder 12 and carries the same out of the processing container 11.

Some of the processes illustrated in FIG. 3 may not be performed. For example, the supply of the drying liquid (S104) may not be performed. In this case, following the supply of the rinsing liquid (S103), the drying of the substrate W (S105) is performed, so that the rinsing liquid remaining on the substrate W is shaken off by a centrifugal force.

Subsequently, the peripheral parts of the processing part 10 will be described with reference to FIG. 1 again. The substrate processing apparatus 1 includes a reservoir 20 configured to recover and store the chemical liquid used in the processing part 10, and a processing line 30 configured to supply the chemical liquid stored in the reservoir 20 to the processing part 10. The reservoir 20 is, for example, a tank.

The processing line 30 connects, for example, a circulation line 40 to be described later and the processing part 10. An upstream end of the processing line 30 is connected to the circulation line 40, and a downstream end of the processing line 30 is connected to the nozzle 16 of the processing part 10. The processing line 30 is provided for each processing part 10.

In the middle of the processing line 30, an opening/closing valve 31 configured to open/close a flow path of the processing line 30, a flow rate regulator 32 configured to regulate a flow rate of the chemical liquid flowing through the flow path of the processing line 30, and a flow meter 33 configured to measure the flow rate of the chemical liquid flowing through the flow path of the processing line 30. The operation of the opening/closing valve 31 and the operation of the flow rate regulator 32 are controlled by the controller 90. The flow meter 33 transmits a signal indicating a measured result to the controller 90.

When the opening/closing valve 31 opens the flow path, the nozzle 16 ejects the chemical liquid. The flow rate of the chemical liquid is measured by the flow meter 33, and the controller 90 controls the flow rate regulator 32 such that the measured value becomes a set value. Meanwhile, when the opening/closing valve 31 closes the flow path, the nozzle 16 stops the ejection of the chemical liquid.

The substrate processing apparatus 1 further includes the circulation line 40. The circulation line 40 takes out the chemical liquid from the reservoir 20 and returns the same to the reservoir 20. An upstream end 40a of the circulation line 40 is connected to the reservoir 20, and a downstream end 40b of the circulation line 40 is also connected to the reservoir 20.

In the middle of the circulation line 40, a pump 41 configured to send out the chemical liquid, a filter 42 configured to collect foreign substances in the chemical liquid, a heater 43 configured to heat the chemical liquid, and a thermometer 45 configured to measure the temperature of the chemical liquid are provided. The controller 90 controls the heater 43 such that the value measured by the thermometer 45 becomes a set value. Thus, it is possible to supply the chemical liquid having a desired temperature to the substrate W.

An etching rate of the polysilicon film on the substrate W by the chemical liquid is determined by the dissolved oxygen concentration of the chemical liquid, or the like. Dissolved oxygen is molecular oxygen ($O_2$) dissolved in a liquid. The higher the dissolved oxygen concentration (unit: mg/L), the more easily the polysilicon film is oxidized and the more easily an oxide film is formed.

When the chemical liquid is a TMAH-containing chemical liquid, the etching rate of the polysilicon film becomes slower as the oxidation of the polysilicon film progresses. This is because the TMAH-containing chemical liquid is poor in etching an oxide film.

Therefore, when the chemical liquid is a TMAH-containing chemical liquid, the higher the dissolved oxygen concentration of the chemical liquid, the slower the etching rate of the polysilicon film by the chemical liquid. This tendency is the opposite of the tendency described in Patent Document 1.

When the chemical liquid is an ammonia solution or a choline solution, the etching rate of the polysilicon film increases as the oxidation of the polysilicon film progresses. This is because the ammonia solution and the choline solution are good in etching an oxide film.

Therefore, when the chemical liquid is an ammonia solution or a choline solution, the higher the dissolved oxygen concentration of the chemical liquid, the faster the etching rate of the polysilicon film by the chemical liquid.

The chemical liquid is ejected from the nozzle 16 of the processing part 10 and then returned to the reservoir 20. During that time, the chemical liquid comes into contact with air, and the oxygen contained in the air dissolves in the chemical liquid. Thus, the dissolved oxygen concentration of the chemical liquid becomes high.

Therefore, the substrate processing apparatus 1 further includes a first gas supply line 50. The first gas supply line 50 is connected to the circulation line 40 and supplies the circulation line 40 with an inert gas such as a $N_2$ gas. A mixed fluid of the supplied inert gas and the chemical liquid is formed.

The circulation line 40 includes an ejection port 40b configured to eject the mixed fluid of the inert gas supplied by the first gas supply line 50 and the chemical liquid taken out from the reservoir 20 into the chemical liquid stored in the reservoir 20. A large number of bubbles of the inert gas are generated inside the reservoir 20. Since the contact area between the inert gas and the chemical liquid is large, the inert gas is efficiently dissolved in the chemical liquid, and oxygen in the chemical liquid is efficiently released into the inert gas according to Henry's law. Therefore, it is possible to efficiently reduce the dissolved oxygen concentration of the chemical liquid.

In the circulation line 40, the mixed fluid of the inert gas and the chemical liquid may collide with the bottom wall of the reservoir 20 such that the bubbles of the inert gas are subdivided by the impact. The specific surface areas of the bubbles increase, and the contact area between the inert gas and the chemical liquid increases. In addition, since the bubbles reach the bottom wall of the reservoir 20 and then float towards the liquid surface of the chemical liquid, it takes a long time to reach the liquid surface. Therefore, it is possible to efficiently reduce the dissolved oxygen concentration of the chemical liquid.

The circulation line 40 may have a connection point 40d with the first gas supply line 50 downstream of the connection points 40c with respective processing lines 30. The connection point 40d is disposed downstream of all the connection points 40c. It is possible to supply a chemical liquid having the same dissolved oxygen concentration to all the processing parts 10.

The first gas supply line 50 includes, for example, a common line 50a and a plurality of individual lines 50b. A downstream end of the common line 50a is connected to the circulation line 40, and an upstream end of the common line 50a is connected to each individual line 50b. In the middle of each individual line 50b, an opening/closing valve 51 configured to open/close a flow path of the individual line 50b, a flow rate regulator 52 configured to regulate a flow rate of the inert gas flowing through the flow path of the individual line 50b, and a flow meter 53 configured to measure the flow rate of the inert gas flowing through the flow path of in the individual line 50b are provided. The operation of the opening/closing valve 51 and the operation of the flow rate regulator 52 are controlled by the controller 90. The flow meter 53 transmits a signal indicating a measured result to the controller 90.

When the opening/closing valve 51 opens the flow path, the first gas supply line 50 supplies the circulation line 40 with an inert gas, and a large number of bubbles of the inert gas are generated inside the reservoir 20. The flow rate of the inert gas is measured by the flow meter 53, and the controller 90 controls the flow rate regulator 52 so that a measured value become a set value Q1 or Q2. Different set values Q1 and Q2 (Q2>Q1) are set for respective individual lines 50b. Meanwhile, when the opening/closing valve 51 closes the flow path, the first gas supply line 50 stops the supply of the inert gas to the circulation line 40.

In this embodiment, in order to smoothly switch the flow rate of the inert gas, the first gas supply line 50 has two individual lines 50b, and each individual line 50b is provided with an opening/closing valve 51, a flow rate regulator 52, and a flow meter 53. However, the technique of the present disclosure is not limited thereto. The first gas supply line 50 may be provided with one opening/closing valve 51, one flow rate regulator 52, and one flow meter 53.

The substrate processing apparatus 1 includes a container 55 connected to the reservoir 20, a chemical liquid recovery line 56 connected to the container 55, and a second gas supply line 60 connected to the container 55. The container 55 temporarily stores the chemical liquid and delivers the chemical liquid to the reservoir 20. The chemical liquid recovery line 56 returns the chemical liquid after being used in the processing part 10 to the reservoir 20 via the container 55. The second gas supply line 60 supplies an inert gas such as a $N_2$ gas into the container 55.

According to the present embodiment, the chemical liquid is temporarily stored in the container 55 after being ejected from the nozzle 16 of the processing part 10 and before being returned to the reservoir 20. Since the interior of the container 55 is filled with the inert gas by the second gas supply line 60, the inert gas is dissolved in the chemical liquid, and the oxygen in the chemical liquid is released into the inert gas according to Henry's law. Therefore, it is possible to bring the dissolved oxygen concentration of the chemical liquid close to the original concentration before the chemical liquid is returned to the reservoir 20.

The chemical liquid recovery line 56 includes, for example, a common line 56a and a plurality of individual lines 56b. The common line 56a is connected to the container 55. Each individual line 56b connects the common line 50a and the processing part 10, and sends the chemical liquid recovered in the cup 17 or the like of the processing part 10 to the common line 50a.

In the middle of the second gas supply line 60, an opening/closing valve 61 configured to open/close a flow path of the second gas supply line 60, a flow rate regulator 62 configured to regulate a flow rate of the inert gas flowing through the flow path of the second gas supply line 60, and a flow meter 63 configured to measure the flow rate of the inert gas flowing through the flow path of the second gas supply line 60 are provided. The operation of the opening/closing valve 61 and the operation of the flow rate regulator 62 are controlled by the controller 90. The flow meter 63 transmits a signal indicating a measured result to the controller 90.

When the opening/closing valve 61 opens the flow path, the second gas supply line 60 supplies the inert gas into the container 55. The flow rate of the inert gas is measured by the flow meter 63, and the controller 90 controls the flow rate regulator 62 such that the measured value becomes a set value Q3. Meanwhile, when the opening/closing valve 61 closes the flow path, the second gas supply line 60 stops the supply of the inert gas to the container 55.

The substrate processing apparatus 1 further includes a chemical liquid supply line 66 connected to the container 55. The chemical liquid supply line 66 supplies a chemical liquid before being used in the processing part 10, that is, a chemical liquid before being deteriorated by etching of the substrate W, to the reservoir 20 via the container 55. As a result, the interior of the reservoir 20 changes from the empty state to a state in which a height of the liquid surface of the chemical liquid is set in advance.

The interior of the reservoir 20 becomes empty when the substrate processing apparatus 1 is started up or when the deteriorated chemical liquid is replaced. The deteriorated chemical liquid has a higher silicon concentration than the chemical liquid before deterioration, for example, an unused chemical liquid, and is discharged to the outside of the reservoir 20 via the drainage line 21. Incidentally, the gas accumulated inside the reservoir 20 is discharged to the outside of the reservoir 20 via the exhaust line 22.

According to the present embodiment, the unused chemical liquid is temporarily stored in the container 55 before being supplied to the reservoir 20. Since the interior of the container 55 is filled with the inert gas by the second gas supply line 60, the inert gas is dissolved in the chemical liquid, and the oxygen in the chemical liquid is released into the inert gas according to Henry's law. Therefore, it is possible to bring the dissolved oxygen concentration of the chemical liquid close to a desired concentration before the unused chemical liquid is supplied to the reservoir 20.

In the middle of the chemical liquid supply line 66, an opening/closing valve 67 configured to open/close a flow path of the chemical liquid supply line 66, a flow rate regulator 68 configured to regulate a flow rate of the chemical liquid flowing through the flow path of the chemical liquid supply line 66, and a flow meter 69 configured to measure the flow rate of the chemical liquid flowing through the flow path of the chemical liquid supply line 66. The operation of the opening/closing valve 67 and the operation of the flow rate regulator 68 are controlled by the controller 90. The flow meter 69 transmits a signal indicating the measured result to the controller 90.

When the opening/closing valve 67 opens the flow path, the chemical liquid supply line 66 supplies the chemical liquid into the container 55. The flow rate of the chemical liquid is measured by the flow meter 69, and the controller 90 controls the flow rate regulator 68 such that the measured value becomes a set value. Meanwhile, when the opening/closing valve 67 closes the flow path, the chemical liquid supply line 66 stops the supply of the chemical liquid to the container 55.

Figure 4:
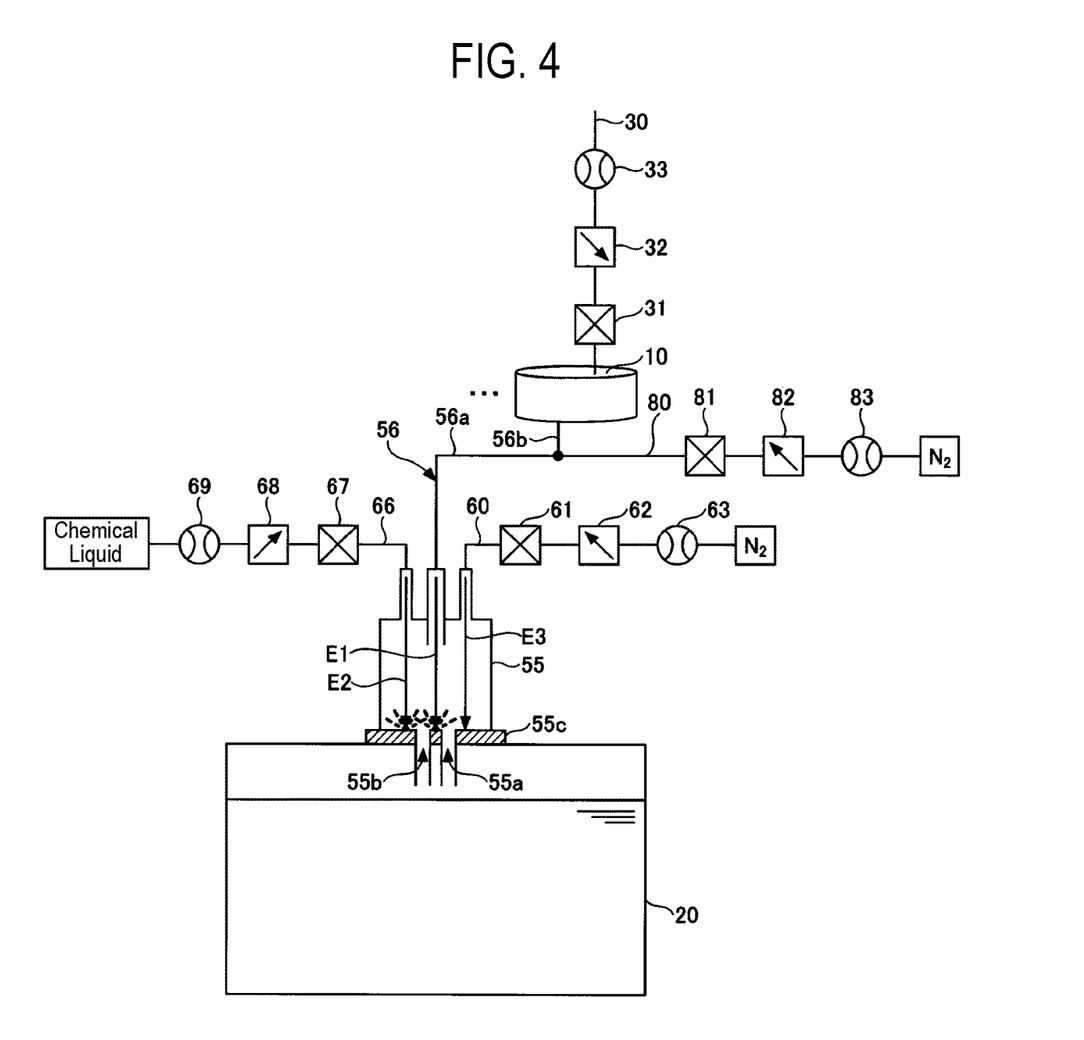
FIG. 4 is a cross-sectional view illustrating an example of a container connected to a reservoir.

Next, a structure of the container 55 will be described with reference to FIG. 4. The container 55 is installed, for example, on the ceiling of the reservoir 20. The container 55 has a wall 55c in which openings 55a and 55b configured to allow the interior of the container 55 and the interior of the reservoir 20 to communicate with each other are formed. The wall 55c is installed horizontally, for example, on the ceiling of the reservoir 20.

The openings 55a and 55b in the wall 55c are arranged so as to be deviated from an extension line E1 of the flow path of the chemical liquid recovery line 56. The extension line E1 is, for example, vertical, and the chemical liquid falls straight down. The wall 55c receives and repels the chemical liquid returned to the container 55 by the chemical liquid recovery line 56. As a result, a large number of droplets of the chemical liquid are formed, and the specific surface area of the chemical liquid increases. Since the contact area between the chemical liquid and the inert gas is large, the inert gas is efficiently dissolved in the chemical liquid, and oxygen in the chemical liquid is efficiently released into the inert gas according to Henry's law. Therefore, it is possible to efficiently reduce the dissolved oxygen concentration of the chemical liquid.

Further, the openings 55a and 55b in the wall 55c are arranged so as to be deviated from an extension line E2 of the flow path of the chemical liquid supply line 66. The extension line E2 is, for example, vertical, and the chemical liquid falls straight down. The wall 55c receives and repels the chemical liquid supplied to the container 55 by the chemical liquid supply line 66. As a result, a large number of droplets of the chemical liquid are formed, and the specific surface area of the chemical liquid increases. Since the contact area between the chemical liquid and the inert gas is large, the inert gas is efficiently dissolved in the chemical liquid, and oxygen in the chemical liquid is efficiently released into the inert gas according to Henry's law. Therefore, it is possible to efficiently reduce the dissolved oxygen concentration of the chemical liquid.

Further, the openings 55a and 55b in the wall 55c are arranged so as to be deviated from an extension line E3 of the flow path of the second gas supply line 60. The extension line E3 is, for example, vertical, and the inert gas falls straight down. The wall 55c receives and repels the inert gas supplied to the container 55 by the second gas supply line 60. As a result, the inert gas is likely to be scattered. The inert gas is efficiently dissolved in the chemical liquid, and oxygen in the chemical liquid is efficiently released into the inert gas according to Henry's law. Therefore, it is possible to efficiently reduce the dissolved oxygen concentration of the chemical liquid.

As illustrated in FIG. 1, the substrate processing apparatus 1 further includes a third gas supply line 70 connected to the reservoir 20. Unlike the second gas supply line 60, the third gas supply line 70 supplies an inert gas, such as a $N_2$ gas, into the reservoir 20 while bypassing the container 55. In addition, unlike the circulation line 40, the third gas supply line 70 includes an inert gas ejection port 70a in a space above the liquid surface of the chemical liquid stored inside the reservoir 20 (an upper space of the reservoir 20).

In the middle of the third gas supply line 70, an opening/closing valve 71 configured to open/close a flow path of the third gas supply line 70, a flow rate regulator 72 configured to regulate a flow rate of the inert gas flowing through the flow path of the third gas supply line 70, and a flow meter 73 configured to measure the flow rate of the inert gas flowing through the flow path of the third gas supply line 70 are provided. The operation of the opening/closing valve 71 and the operation of the flow rate regulator 72 are controlled by the controller 90. The flow meter 73 transmits a signal indicating a measured result to the controller 90.

When the opening/closing valve 71 opens the flow path, the third gas supply line 70 supplies the inert gas into the reservoir 20. The flow rate of the inert gas is measured by the flow meter 73, and the controller 90 controls the flow rate regulator 72 such that the measured value becomes a set value Q4. Meanwhile, when the opening/closing valve 71 closes the flow path, the third gas supply line 70 stops the supply of the inert gas to the reservoir 20.

In addition, the substrate processing apparatus 1 further includes a fourth gas supply line 80. The fourth gas supply line 80 is connected to the chemical liquid recovery line 56 and supplies the chemical liquid recovery line 56 with an inert gas such as a $N_2$ gas. The interior of the chemical liquid recovery line 56 is filled with the inert gas, which makes it possible to suppress the inflow of air from the processing part 10 to the chemical liquid recovery line 56. Thus, it is possible to suppress the contact between the air and the chemical liquid. Accordingly, it is possible to suppress an increase in the dissolved oxygen concentration of the chemical liquid.

The fourth gas supply line 80 is connected to the common line 56a of the chemical liquid recovery line 56, and supplies the inert gas to the common line 56a. The fourth gas supply line 80 is connected to the common line 56a upstream of respective individual lines 56b. The entire common line 56a is filled with the inert gas, which makes it possible to suppress the inflow of air from all the processing parts 10 to the chemical liquid recovery line 56.

In the middle of the fourth gas supply line 80, an opening/closing valve 81 configured to open/close a flow path of the fourth gas supply line 80, a flow rate regulator 82 configured to regulate a flow rate of the inert gas flowing through the flow path of the fourth gas supply line 80, and a flow meter 83 configured to measure the flow rate of the inert gas flowing through the flow path of the fourth gas supply line 80 are provided. The operation of the opening/closing valve 81 and the operation of the flow rate regulator 82 are controlled by the controller 90. The flow meter 83 transmits a signal indicating a measured result to the controller 90.

When the opening/closing valve 81 opens the flow path, the fourth gas supply line 80 supplies the inert gas to the chemical liquid recovery line 56. The flow rate of the inert gas is measured by the flow meter 83, and the controller 90 controls the flow rate regulator 82 such that the measured value becomes a set value Q5. Meanwhile, when the opening/closing valve 81 closes the flow path, the fourth gas supply line 80 stops the supply of the inert gas to the chemical liquid recovery line 56.

Figure 5:
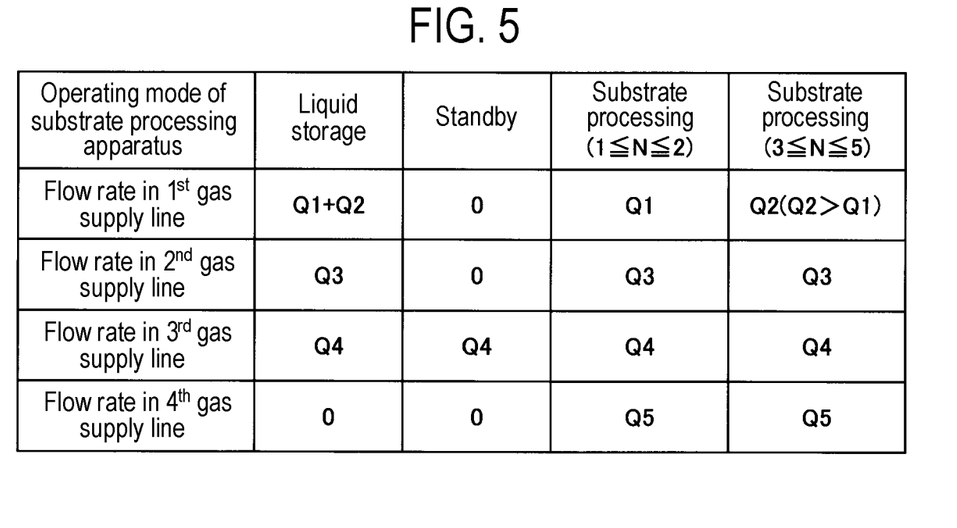
FIG. 5 is a table showing examples of setting flow rates of respective gas supply lines.

Next, the setting of the flow rate of each gas supply line will be described with reference to FIG. 5. In FIG. 5, N is the operation number of the processing line 30, and is, for example, an integer of 1 to 5. The operation number of processing lines 30 is the number of processing lines 30 in the state in which the opening/closing valve 31 opens the flow path and the nozzle 16 ejects the chemical liquid. The installation number of processing parts 10 and the installation number of processing lines 30 may be two or more, rather than being limited to five. The maximum value of N is equal to the installation number of processing lines 30.

A liquid storage mode is a state in which an unused chemical liquid is stored inside the reservoir 20. In the liquid storage mode, the chemical liquid supply line 66 supplies the unused chemical liquid to the reservoir 20. In addition, in the liquid storage mode, the circulation line 40 takes out the chemical liquid from the reservoir 20 and returns the same to the reservoir 20. In the liquid storage mode, since the amount of the chemical liquid inside the reservoir 20 is insufficient, the processing line 30 stops the supply of the chemical liquid to the processing part 10.

The unused chemical liquid supplied to the reservoir 20 in the liquid storage mode has a high dissolved oxygen concentration like the chemical liquid recovered from the processing part 10 to the reservoir 20 in a substrate processing mode to be described later. In addition, the unused chemical liquid supplied to the reservoir 20 in the liquid storage mode has a higher flow rate than that of the chemical liquid recovered from the processing part 10 to the reservoir 20 in the substrate processing mode.

Therefore, in the liquid storage mode, the flow rate of the inert gas supplied to the circulation line 40 by the first gas supply line 50 is higher than that in the substrate processing mode. It is possible to reduce the dissolved oxygen concentration of the unused chemical liquid to a desired concentration in a short period of time.

Further, in the case of the liquid storage mode, the chemical liquid supply line 66 supplies the unused chemical liquid to the reservoir 20 via the container 55. Therefore, the second gas supply line 60 supplies the inert gas into the container 55. In addition, the third gas supply line 70 supplies the inert gas into the reservoir 20.

In the case of the liquid storage mode, the processing line 30 stops the supply of the chemical liquid to the processing part 10, and thus the chemical liquid does not flow from the processing part 10 into the chemical liquid recovery line 56. Therefore, the fourth gas supply line 80 stops the supply of the inert gas to the chemical liquid recovery line 56. This makes it possible to prevent the use of unnecessary inert gas. In the case of the liquid storage mode, it is possible to suppress the unnecessary use of inert gas compared to the case of the substrate processing mode when the flow rate of the inert gas supplied to the chemical liquid recovery line 56 of the fourth gas supply line 80 is low.

In the standby mode, a desired amount of the chemical liquid is accumulated inside the reservoir 20, the chemical liquid supply line 66 stops the supply of the chemical liquid to the reservoir 20, and the processing line 30 stops the supply of the chemical liquid to the processing part 10. In the standby mode, the circulation line 40 takes out the chemical liquid from the reservoir 20 and returns the same to the reservoir 20. The temperature of the chemical liquid is maintained at a desired temperature.

In the case of the standby mode, the processing line 30 stops the supply of the chemical liquid to the processing part 10, and thus the chemical liquid does not flow from the processing part 10 into the chemical liquid recovery line 56. Therefore, the fourth gas supply line 80 stops the supply of the inert gas to the chemical liquid recovery line 56. This makes it possible to prevent the use of unnecessary inert gas.

In the case of the standby mode, both the chemical liquid recovery line 56 and the chemical liquid supply line 66 stop the supply of the chemical liquid to the reservoir 20 via the container 55. Therefore, the second gas supply line 60 stops the supply of the inert gas into the container 55. It is possible to prevent the use of unnecessary inert gas. In addition, the first gas supply line 50 stops the supply of the inert gas to the circulation line 40.

In the case of the standby mode, the third gas supply line 70 may supply the inert gas into the reservoir 20. Since it is possible to prevent the infiltration of ambient air into the upper space of the reservoir 20, it is possible to prevent the contact between the air and the chemical liquid.

In the substrate processing mode, a desired amount of the chemical liquid is accumulated inside the reservoir 20, the chemical liquid supply line 66 stops the supply of the chemical liquid to the reservoir 20, and the processing line 30 supplies the chemical liquid to the processing part 10. In the substrate processing mode, the circulation line 40 takes out the chemical liquid from the reservoir 20 and returns the same to the reservoir 20.

In the case of the substrate processing mode, the processing line 30 supplies the chemical liquid to the processing part 10. As a result, the chemical liquid flows from the processing part 10 into the chemical liquid recovery line 56. Therefore, the fourth gas supply line 80 supplies the inert gas to the chemical liquid recovery line 56.

Further, in the case of the substrate processing mode, the chemical liquid recovery line 56 supplies the chemical liquid to the reservoir 20 via the container 55. Therefore, the second gas supply line 60 supplies the inert gas into the container 55. In addition, the first gas supply line 50 supplies the inert gas to the circulation line 40.

In the substrate processing mode, the flow rate of the chemical liquid returned from the chemical liquid recovery line 56 to the reservoir 20 changes depending on the operation number of processing lines 30. Therefore, the controller 90 may control the flow rate of the inert gas to be supplied to the circulation line 40 by the first gas supply line 50 depending on the operation number of processing lines 30. As the operation number of processing lines 30 increases, the flow rate of the inert gas is set to be high. The operation number of processing lines 30 may be obtained based on, for example, the number of opening/closing valves 31 in the open state.

The controller 90 may control the flow rate of the inert gas to be supplied to the circulation line 40 by the first gas supply line 50 depending on the total flow rate in the processing line 30. As the total flow rate of the processing lines 30 increases, the flow rate of the inert gas is set to be high. The total flow rate of the processing lines 30 is measured by a plurality of flow meters 33.

In the case of the substrate processing mode, the third gas supply line 70 supplies the inert gas into the reservoir 20. Since it is possible to prevent the infiltration of ambient air into the upper space of the reservoir 20, it is possible to prevent the contact between the air and the chemical liquid.

The state of the substrate processing apparatus 1 is shifted to the liquid storage mode and the standby mode in this order when the substrate processing apparatus 1 is started up. Thereafter, the state of the substrate processing apparatus 1 is alternately shifted to the substrate processing mode and the standby mode. When the chemical liquid is deteriorated, the chemical liquid inside the reservoir 20 is discharged, and the chemical liquid is replaced.

When exchanging the chemical liquid, the state of the substrate processing apparatus 1 is shifted to the liquid storage mode and the standby mode again in this order. Thereafter, the state of the substrate processing apparatus 1 is alternately shifted to the substrate processing mode and the standby mode. When the chemical liquid is deteriorated, the chemical liquid inside the reservoir 20 is discharged again, and the chemical liquid is replaced.

According to an aspect of the present disclosure, when an alkaline chemical liquid is recovered and reused, it is possible to efficiently reduce a dissolved oxygen concentration of a chemical liquid.

Although the embodiments of the substrate processing apparatus and the substrate processing method according to the present disclosure have been described above, the present disclosure is not limited to the above-described embodiments. Various changes, modifications, substitutions, additions, deletions, and combinations can be made within the scope of the claims. Of course, these also fall within the technical scope of the present disclosure.

What is claimed is:

1. A substrate processing apparatus comprising:
   at least one processing part including a processing container and configured to etch a polysilicon film or an amorphous silicon film formed on a substrate using an alkaline chemical liquid;
   a reservoir configured to recover and store the chemical liquid used in the at least one processing part;
   processing lines configured to supply the chemical liquid stored in the reservoir to the at least one processing part;
   a circulation line configured to take out the chemical liquid from the reservoir and to return the taken-out chemical liquid to the reservoir;
   a first gas supply line connected to the circulation line and configured to supply an inert gas to the circulation line;
   a flow rate regulator configured to regulate a flow rate of the inert gas to be supplied to the circulation line by the first gas supply line;

a controller constituted by a computer and configured to control the flow rate regulator;

a container connected to the reservoir and configured to temporarily accommodate the chemical liquid and to deliver the chemical liquid to the reservoir;

a chemical liquid recovery line connected to the container and configured to return the chemical liquid after being used in the at least one processing part to the reservoir via the container; and a second gas supply line connected to the container and configured to supply the inert gas into an interior of the container, wherein the circulation line includes an ejection port configured to eject a mixed fluid of the inert gas supplied by the first gas supply line and the chemical liquid taken out from the reservoir into the chemical liquid stored in the reservoir, wherein the container has a wall in which an opening is formed to allow the interior of the container and an interior of the reservoir to communicate with each other, wherein the opening is arranged so as to be deviated from an extension line of a flow path of the chemical liquid recovery line, and wherein the wall receives and repels the chemical liquid returned to the container by the chemical liquid recovery line.

2. The substrate processing apparatus of claim 1, wherein the at least one processing part includes a plurality of processing parts, the processing lines are provided in the plurality of processing parts, respectively, and the controller is configured to control the flow rate regulator of the first gas supply line according to an operation number of the processing lines or a total flow rate of the processing lines.

3. The substrate processing apparatus of claim 2, further comprising:

a chemical liquid supply line connected to the container and configured to supply the chemical liquid before being used in the at least one processing part to the reservoir via the container.

4. The substrate processing apparatus of claim 3, wherein the container has the wall in which the opening is formed to allow the interior of the container and the interior of the reservoir to communicate with each other, the opening is arranged so as to be deviated from the extension line of the flow path of the chemical liquid supply line, and the wall receives and repels the chemical liquid supplied to the container by the chemical liquid supply line.

5. The substrate processing apparatus of claim 4, wherein, in a liquid storage mode in which the chemical liquid supply line supplies the chemical liquid to the container and the processing lines stop supplying the chemical liquid to the at least one processing part, a flow rate of the inert gas supplied to the circulation line by the first gas supply line is higher than that in a substrate processing mode in which the chemical liquid supply line stops supplying the chemical liquid to the container and the processing lines supply the chemical liquid to the at least one processing part.

6. The substrate processing apparatus of claim 5, further comprising:

a third gas supply line connected to the reservoir and configured to supply the inert gas to the reservoir while bypassing the container, wherein, in a standby mode in which the chemical liquid supply line stops supplying the chemical liquid to the container and the processing lines stop supplying the chemical liquid to the at least one processing part, the third gas supply line supplies the inert gas to the reservoir.

7. The substrate processing apparatus of claim 5, further comprising:

a fourth gas supply line connected to the chemical liquid recovery line and configured to supply the inert gas to the chemical liquid recovery line.

8. The substrate processing apparatus of claim 7, wherein, in the liquid storage mode, a flow rate of the inert gas supplied to the chemical liquid recovery line by the fourth gas supply line is lower than that in the substrate processing mode.

* * * * *